(12) United States Patent
Schuh

(10) Patent No.: US 7,795,789 B2
(45) Date of Patent: Sep. 14, 2010

(54) MONOLITHIC PIEZOELECTRIC COMPONENT COMPRISING A MECHANICAL UNCOUPLING, METHOD FOR PRODUCING SAME AND USE THEREOF

(75) Inventor: Carsten Schuh, Baldham (DE)

(73) Assignee: Siemens Aktiengesellschaft, Munich (DE)

( * ) Notice: Subject to any disclaimer, the term of this patent is extended or adjusted under 35 U.S.C. 154(b) by 262 days.

(21) Appl. No.: 11/887,629

(22) PCT Filed: Mar. 9, 2006

(86) PCT No.: PCT/EP2006/060602

§ 371 (c)(1),
(2), (4) Date: Oct. 1, 2007

(87) PCT Pub. No.: WO2006/103154

PCT Pub. Date: Oct. 5, 2006

(65) Prior Publication Data

US 2009/0015109 A1  Jan. 15, 2009

(30) Foreign Application Priority Data

Apr. 1, 2005 (DE) .................. 10 2005 015 112

(51) Int. Cl.
*H01L 41/083* (2006.01)
(52) U.S. Cl. .................. 310/364; 310/328
(58) Field of Classification Search .......... 310/328, 310/364
See application file for complete search history.

(56) References Cited

U.S. PATENT DOCUMENTS

| 6,230,378 | B1 | 5/2001 | Cramer et al. |
| 7,208,862 | B2 * | 4/2007 | Florian et al. ............ 310/366 |
| 2002/0080213 | A1 * | 6/2002 | Shimada et al. ............. 347/68 |
| 2005/0035686 | A1 * | 2/2005 | Florian et al. ............ 310/328 |
| 2006/0055288 | A1 | 3/2006 | Heinzmann et al. |
| 2006/0181178 | A1 | 8/2006 | Kastl et al. |
| 2006/0238073 | A1 | 10/2006 | Ragossnig et al. |
| 2007/0069611 | A1 * | 3/2007 | Lee ........................ 310/328 |

FOREIGN PATENT DOCUMENTS

| DE | 34 35 807 A1 | 4/1986 |
| DE | 102 01 641 A1 | 8/2003 |
| DE | 103 07 825 A1 | 9/2004 |
| JP | 61-159777 | 7/1986 |
| WO | 2006/000479 A1 | 1/2006 |

\* cited by examiner

*Primary Examiner*—Walter Benson
*Assistant Examiner*—Bryan P Gordon
(74) *Attorney, Agent, or Firm*—Young & Thompson

(57) ABSTRACT

A piezoelectric component includes at least one monolithic piezo element, having at least a first electrode layer, at least a second electrode layer and at least one piezoceramic layer located between the electrode layers. The piezoelectric component is characterized in that at least between one of the electrode layers and the piezoceramic layer is provided an uncoupling layer which is in direct contact with at least one of the layers for mechanically uncoupling the electrode layer and the piezoceramic layer. A method for producing such a piezoelectric component is disclosed. The piezoelectric component is used in automotive technique for controlling an internal combustion engine injection valve.

20 Claims, 2 Drawing Sheets

MONOLITHIC PIEZOELECTRIC COMPONENT COMPRISING A MECHANICAL UNCOUPLING, METHOD FOR PRODUCING SAME AND USE THEREOF

The invention concerns a piezoelectric component with at least one monolithic piezo element, having at least a first electrode layer, at least a second electrode layer and at least one piezoceramic layer located between the electrode layers. A method for producing said component and use thereof are also specified.

The piezoelectric component is for example a piezoelectric actuator (piezo actuator) with a monolithic actuator body comprising a plurality of monolithic piezo elements stacked one on top of the other. The electrode layers, which are referred to as inner electrodes, and the piezoceramic layers are stacked one on top of the other in an alternating manner and sintered together to the monolithic actuator body.

Such a piezoelectric actuator is for example known from U.S. Pat. No. 6,230,378 B1. The piezoceramic layers consist of a lead zirconate titanate (Pb(Ti,Zr)O$_3$, PZT). The electrode layers consist of a silver/palladium alloy. The piezoceramic layers and the electrode layers are connected to one another in such a way that, by electrically controlling the electrode layers, an electrical field is introduced into each of these piezoceramic layers. The introduced electrical field leads to a deflection of the specific piezoceramic layer and for this reason to a deflection of the specific piezo element or to a deflection of the entire piezoelectric actuator.

For electrically contacting the electrode layers, adjacent electrode layers are routed, in the direction of the stack, alternately to two lateral surface sections of the actuator body which are electrically insulated from each other. At these surface sections, the actuator body in each case has a metallization in the form of a strip.

In the region of the described surface sections of the actuator body, each of these piezo elements is piezoelectrically inactive. Due to the alternate routing of the electrode layers on the surface sections, an electrical field is introduced into a piezoelectrically inactive region of the piezoelectric layer, which is clearly differentiated from the electrical field which is introduced into a piezoelectrically active region of the piezoceramic layer. Unlike the piezoelectrically inactive region, the piezoelectrically active region of the piezoceramic layer is located directly between the electrode layers of the piezo element.

During the electrical control of the electrode layers, thus when polarizing the piezoceramic and/or during the operation of the piezo actuator, the different electrical fields result in different deflections of the piezoceramic layer in the piezoelectrically active region and in the piezoelectrically inactive region. Therefore, as a result of this, mechanical stresses occur in the piezo element, which in this way can lead to the formation of a so-called polarity crack across the direction of the stack or to the growth of an existing polarity crack. Such a polarity crack, in particular occurs at a boundary surface between an electrode layer and an adjacent piezoceramic layer. In such cases the polarity crack can continue into the metallization applied to the specific surface section of the actuator body. This leads to an interruption of the electrical contacting of at least one part of the electrode layers of the actuator body.

In the case of the piezoelectric actuator known from U.S. Pat. No. 6,230,378 B1 the closest and most rigid bond is ensured between the electrode layers and the piezoceramic layers. There is a high mechanical interconnection strength between the electrode layers and the adjacent piezoceramic layers. On way in which this is achieved is by the selection of the electrode material and the piezoceramic. When sintering the corresponding raw body, silver of the silver/palladium alloy of the electrode material diffuses into the piezoceramic layer.

However, the resulting solid bond cannot prevent the formation of cracks and the propagation of cracks during the polarization of the piezoelectric component or during the operation of the piezoelectric component. On the contrary: during the dynamic operation of the described piezoelectric actuator, an existing polarity crack can be deflected. Propagation of the polarity crack takes place in an uncontrolled manner. For example, the propagation of the polarity crack does not take place across the direction of the stack but in parallel or more or less in parallel to the direction of the stack. A longitudinal crack is formed in the actuator body. The uncontrolled propagation of a polarity crack can be based on unfavorable intrinsic and/or extrinsic influencing variables. Intrinsic influencing variables involve for example the fine structure of a piezoceramic layer and/or an electrode layer. The fine structure within the specific layer can lead to an anisotropic crack resistance. The crack resistance is different within the layer in different directions. Extrinsic influencing variables are for example based on an electrical leading edge during the dynamic operation or on an insufficient clamping of the actuator body. An uncontrolled propagation of a polarity crack can lead to the failure of a piezoelectric actuator. There is no guarantee of actuator reliability.

Solutions for preventing the uncontrolled propagation of cracks in an actuator body are known from DE 102 34 787 C1 and DE 103 07 825 A1 respectively. In this processes, so-called predetermined rupture points are introduced in the form of ceramic protective layers. These ceramic protective layers are characterized by microfaults. If mechanical stresses occur in the actuator body, the formation of cracks and the propagation of cracks preferably take place in ceramic protective layers with the microfaults. The formation of cracks and the propagation of cracks are limited to the ceramic protective layers.

Microfaults in the protective layers are for example achieved by increasing the porosity of the protective layers compared to the piezoceramic layers in the actuator body. However, by increasing the porosity in the protective layers, the piezoelectrically active volume of the actuator body decreases compared to an actuator body without protective layers. In order to achieve a certain lift, the actuator body must be controlled with a higher electrical voltage than that of a comparable actuator body without protective layers. As an alternative, the actuator body must be higher in order to obtain almost the same piezoelectrically active volume.

The object underlying the present invention is thus to provide a piezoactuator with an actuator body, which has a comparable reliability to the prior art, but a higher piezoelectrically active volume compared to the prior art.

This object is achieved by specifying a piezoelectric component with at least a monolithic piezo element, comprising a first electrode layer, at least one second electrode layer and at least one piezoceramic layer located between the electrode layers. The piezoelectric component is characterized in that at least between one of the electrode layers and the piezoceramic layer an uncoupling layer is provided which is in direct contact with at least one of the layers for mechanically uncoupling the electrode layer and the piezoceramic layer.

This object is also achieved by means of a method for producing such a piezoelectric component. In this process, said method includes the following steps:

a) providing a raw stratified body comprising at least one raw ceramic film consisting of a piezoceramic material, at least one electrode consisting of film of an electrode material and at least one uncoupling film which is located between the raw film and the electrode film and which is made of an uncoupling material and b) Sintering the raw body, with the piezoceramic layer being formed from the raw film, the uncoupling layer from the uncoupling film and the electrode layer from the electrode film.

The invention is based on the knowledge that a constantly solid and an extremely close bond between the electrode layers and the piezoceramic layers of an actuator can lead to an uncontrolled propagation of cracks. Therefore, it is ensured that the bond between an electrode layer and the adjacent piezoceramic layer is weakened. This is accomplished by means of the uncoupling layer. Thus, a weakened boundary surface between the electrode layer and the piezoceramic layer is obtained. At the weakened boundary surface, smaller mechanical stresses arise compared to the known monolithic piezo elements. A probability of the occurrence of cracks and a probability of uncontrolled propagation of cracks are lowered. At the same time a relatively high piezoelectrically active volume is present.

In accordance with a particular embodiment the uncoupling layer is a partial layer of the electrode layer and/or a partial layer of the piezoceramic layer. This means for example that the uncoupling layer is made of an electrically conducting material. The uncoupling layer forms part of the inner electrode. The electrically conducting material is for example made of titanium, nickel or platinum. With the help of the uncoupling layers made of these metals, the electrical field necessary for the deflection of the piezo element is introduced into the piezoceramic layer. The materials mentioned could also have oxidized at the specific surface, so that not the metals directly, but titanium dioxide ($TiO_2$), nickel oxide (NiO) and platinum oxide (PtO) bond with the piezoceramic layer. However, it is also conceivable for the uncoupling layer to be a partial layer of the piezoceramic layer. To this end, the uncoupling material, which consists of the uncoupling layer, is a piezoceramic material. In addition it is also conceivable for the uncoupling layer to not be piezoelectrically active itself. The uncoupling layer is made of any ceramic material. Advantageously his ceramic material has a high dielectric constant. Thus the electrical field produced with the help of the electrode layer can be introduced directly via the uncoupling layer into the adjacent piezoceramic layer.

In a particular embodiment, a plurality of piezo elements are provided for a monolithic actuator body stacked in the direction of the stack. The piezo elements are stacked one on top of the other in the actuator body. In this process, the actuator body can only consist of piezo elements with at least one uncoupling layer in each case. In a particular embodiment, the piezo element and at least one further piezo element are provided for a monolithic actuator body stacked in the direction of the stack, with the further piezo element having at least two further electrode layers and at least one further piezoceramic layer located between the further electrode layers. The further piezoceramic layer can be made of a piezoceramic material other than that of the piezoceramic layer of the piezo element with the uncoupling layer. Advantageously however, the piezo element and the further piezo element feature the same piezoceramic material. For example, more further piezo elements without an uncoupling layer than piezo elements are arranged one on top of the other. The result is an actuator body in which just a few uncoupling layers are present. These uncoupling layers are distributed along the direction of the stack of the actuator body.

In a further embodiment, a plurality of piezo elements and a plurality of further piezo elements are arranged to form the monolithic, stacked actuator body in such a way that adjacent piezo elements in each case have at least one common electrode layer and the common electrode layers are routed in the direction of the stack of the actuator body alternately to at least two lateral surface sections of the actuator body which are electrically insulated from each other. A lateral surface section of the actuator body is for example formed by a side surface or by an edge of the actuator body onto which a metallization track is applied. An actuator body with a multi-layer capacitor structure is present. Within said multi-layer capacitor structures, the electrode layers are routed alternately to surface sections which are electrically insulated from each other.

With regard to the production method, the following additional steps are carried out for providing a raw body: c) providing the raw ceramic film, d) arranging the uncoupling film on the raw film and e) arranging the electrode film on the uncoupling film.

In particular a spin coating process, a silk-screen printing process and/or a vapor deposition process are executed for arranging the uncoupling film uncoupling material and the electrode film electrode material. The films are applied one on top of the other with appropriate layer thicknesses. After the application, a lamination, a removal of binder and a common sintering are undertaken. During sintering, the uncoupling layer can already achieve its effect. The uncoupling layer for example functions as a diffusion barrier. This means that components of the electrode layer and/or components of the piezoceramic layer cannot diffuse through the uncoupling layer. A smaller adhesive strength between the electrode layer and the piezoceramic layer is obtained. To this end, an uncoupling layer made of titanium or tungsten is particularly suitable. An uncoupling layer made of these metals functions as efficient diffusion barrier for silver or copper.

In accordance with a particular embodiment an uncoupling layer exhibits a shrinkage behavior during sintering, which differs from the shrinkage behavior of the electrode layer formed when sintering and/or from the shrinkage behavior of the piezoceramic layer formed when sintering, and an adhesion between the layers which form is so negligible that it causes an uncoupling. If it is ensured that the adhesion between the adjacent layers is relatively negligible, the layers can slide off each other during the compacting. The result is a lower adhesive strength between the layers.

In accordance with a particular embodiment, the uncoupling layer exhibits thermal expansion at a specific temperature which differs from a thermal expansion of the electrode layer and/or from a thermal expansion of the piezoceramic layer by at least 10%. This for example makes it possible for adjacent layers to slide off each other during the cooling procedure after sintering.

To summarize, the following important advantages are achieved with the invention:

- Because of the specific weakening of the boundary surface between the electrode layer and the piezoceramic layer, smaller mechanical stresses occur by comparison with the prior art.
- Said smaller mechanical stresses lead to a piezoelectric component with a reliability comparable to the prior art.
- The piezoelectrically active volume of the actuator body of the component is larger with approximately the same reliability by comparison with the prior art.
- Production of the actuator body can continue to employ known methods.

The invention is described in more detail below with reference to a number of exemplary embodiments and the associated drawings. The figures are schematic and do not represent true-to-scale illustrations.

Figure 3:
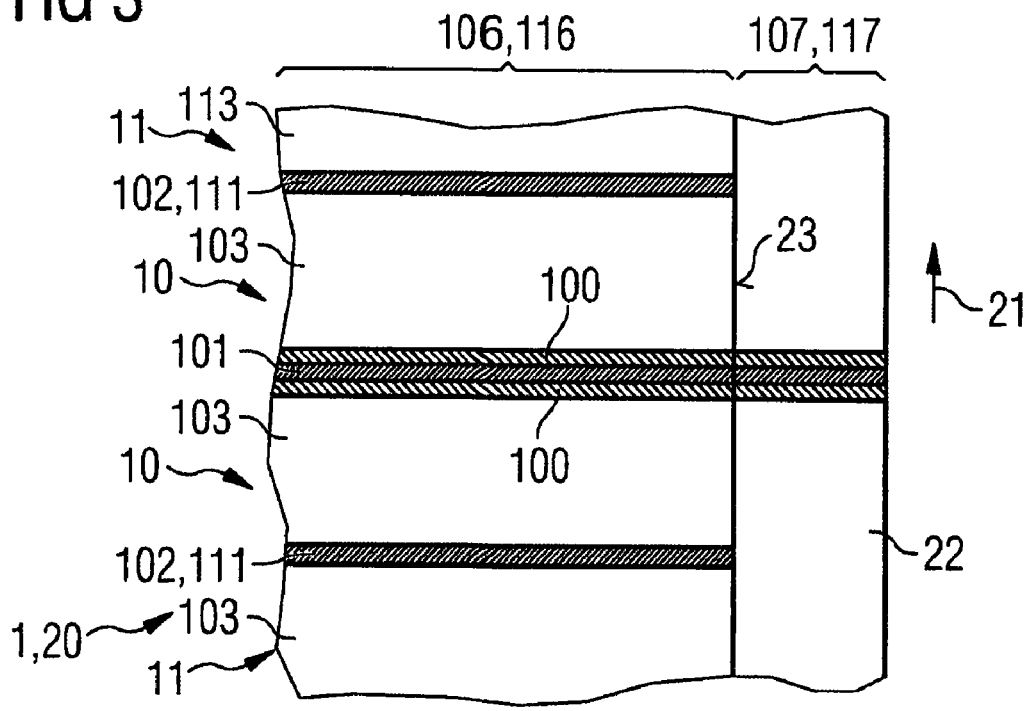
Figure 4:
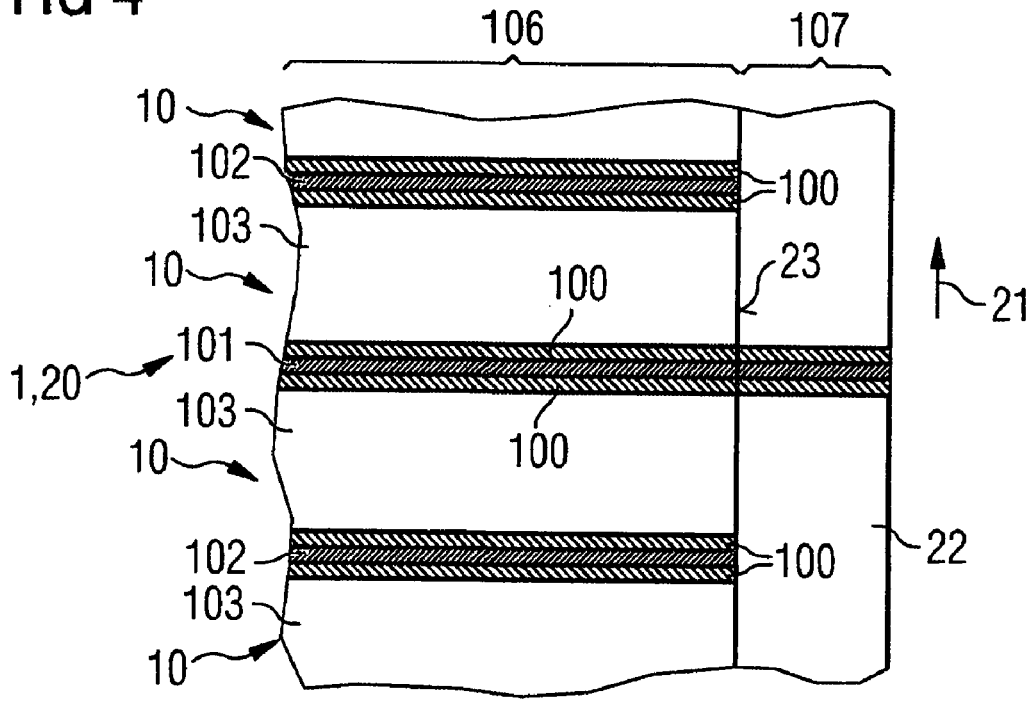

FIGS. 3 and 4 in each case show a section of a cross-section of a piezoelectric component viewed from the side in the form of a piezo actuator in a monolithic multi-layer design.

The piezoelectric component 1 is a piezoelectric actuator with an actuator body 20 in a monolithic multilayer design (FIGS. 3 and 4). A surface area of the actuator body 20 is square.

Figure 1:
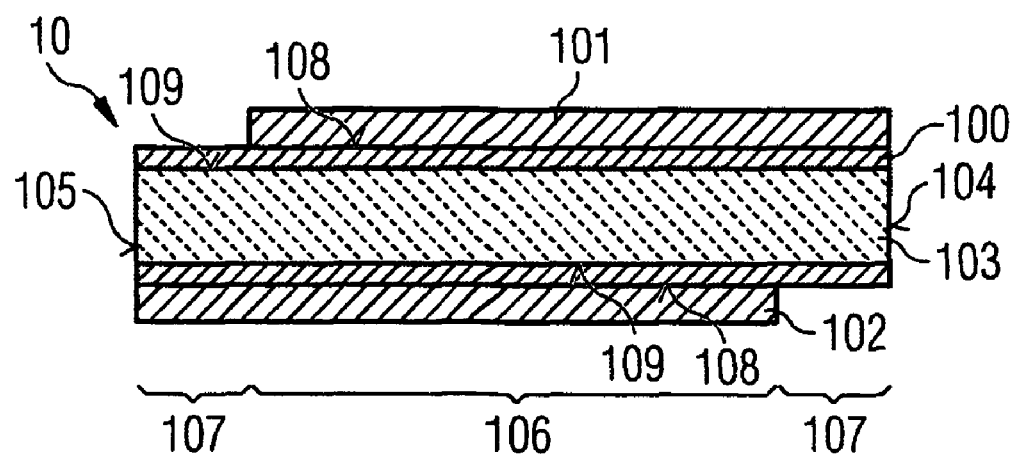
FIG. 1 shows a cross-section of a piezo element with an uncoupling layer viewed from the side.
Figure 2:
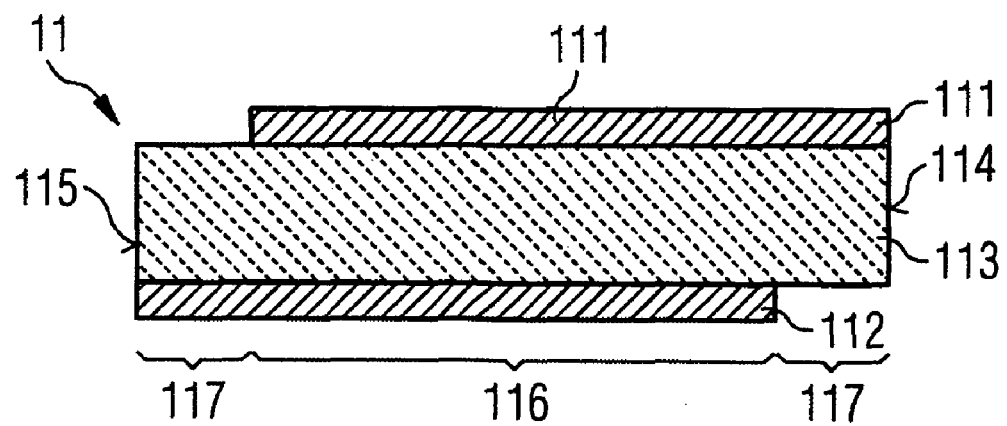
FIG. 2 shows a cross-section of a further piezo element without an uncoupling layer viewed from the side.

The actuator body 20 consists of piezo elements 10, stacked one on top of the other, with an uncoupling layer 100 (FIG. 1) and further piezo elements 11 without an uncoupling layer (FIG. 2). The piezo elements 10 and the further piezo elements 11 are stacked one on top of the other in such a way that adjacent piezo elements have common electrode layers.

A piezo element 10 has a first electrode layer 101, at least one second electrode layer 102 and at least one piezoceramic layer 103 located between the electrode layers 101 and 102. The piezoceramic layer 113 consists of a lead zirconate titanate. The electrode layers 101 and 102 consist of a silver/palladium alloy. The electrode layers 101 and 102 are arranged in such a way on the main areas of the piezoceramic layer 103 that, by electrically controlling the electrode layers 101 and 102, an electrical field is introduced into the piezoceramic layer 103 so that a deflection of the piezoceramic layer 103 and thereby a deflection of the piezo element 10 is obtained.

For electrical contacting the electrode layers 101 and 102 are routed to two lateral surface sections 104 and 105 of the piezo element 10 which are electrically insulated from each other. At these surface sections 104 and 105, the two electrode layers 101 and 102 are in each case electrically contacted with an electrical connection element (not shown in FIG. 1). Due to the routing of the electrode layers 101 and 102 to the surface sections 104 and 105 separated from one another, the piezo element 10 has one piezoelectrically active region 106 and at least two piezoelectrically inactive regions 107.

An uncoupling layer 100 directly bonding with at least one of the layers 101, 102 and 103 for mechanically uncoupling the electrode layer 101, 102 and the piezoceramic layer 103 is located at least between one of the electrode layers 101 and 102 and the piezoceramic layer 103 of the piezo element 10. With each uncoupling layer 100, a boundary surface 108 is obtained between the coupling layer and the adjacent electrode layer 101 and/or 102 and a boundary surface 109 is obtained between the uncoupling layer 100 and the adjacent piezoceramic layer 103. By means of the uncoupling layer 100 it is ensured that between the electrode layer 101 or 102 and the piezoceramic layer 103 the adhesive strength is relatively negligible. The reduced adhesive strength leads to the uncoupling layer 100 or one of the resulting boundary surfaces 108 or 109 being able to function as a predetermined rupture point. Mechanically overloading the piezoelectric component results in the formation of cracks on at least one of the boundary surfaces 108 or 109.

In accordance with one embodiment, a plurality of piezo elements 10 are provided for a monolithic actuator body 20 stacked in the direction of the stack one on top of the other (FIG. 4). Adjacent piezo elements 10 have common electrode layers. The common electrode layers are routed alternately to two surface sections 23 of the actuator body 20 which are electrically insulated from each other. A metallization track 22 for electrical contacting of the electrode layers is applied there in each case.

In accordance with a further embodiment a plurality of piezo elements 10 and a plurality of further piezo elements 11 are provided for an actuator body 20 stacked in the direction of the stack one on top of the other (FIG. 3). Adjacent piezo elements 10 and further piezo elements 11 have common electrode layers which are routed alternately to the surface sections 23 of the actuator body 20 which are separated from one another. Here too a metallization track 22 for electrical contacting of the electrode layers is applied in each case.

In principle, the further piezo elements 11 are constructed in precisely the same way as a piezo element 10. A further piezo element 11 has a further electrode layer 111, at least one further electrode layer 112 and at least one further piezoceramic layer 113 located between the further electrode layers 111 and 112. The further piezoceramic layer 113 consists of the same lead zirconate titanate as the piezoceramic layer 103 of the piezo element 10. The further electrode layers 111 and 112 likewise consist of a silver/palladium alloy. The further electrode layers 111 and 112 are routed to the lateral surface sections 114 and 115 of the further piezo element 11 and electrically contacted there. Electrically controlling the further electrode layers 111 and 112 brings about a deflection of the further piezo element 11. The further electrode layers 111 and 112 and the further piezoceramic layer 113 of the further piezo element 11 are embodied and arranged next to each other in such a way that a further piezoelectrically active region 116 and piezoelectrically inactive regions 117 of the further piezo element 11 are obtained.

In accordance with a first form of embodiment, the uncoupling layer 100 is a partial layer of the electrode layer 101 or the electrode layer 102. This means that the corresponding electrode layer is a multilayer. The uncoupling layer 100 has a metal as the uncoupling material. The metal is titanium. To this end, in an alternate embodiment, the electrode layer has an electrically conducting ceramic. This material is chromium oxide.

For the production of the piezoelectric component, the followings steps are carried out: providing a raw ceramic film, providing an uncoupling film with uncoupling material on the raw film, providing an electrode film with electrode material on the uncoupling film, and stacking such partial stacks one on top of the other. The resulting total stack is subsequently laminated, binder removed and sintered. When sintering, the piezoceramic layer is obtained from the raw ceramic film, the uncoupling layer from the uncoupling film and the electrode layer from the electrode film. In order to provide the uncoupling film and to provide the electrode film, a vapor deposition process is carried out in a first embodiment. As an alternative to this, a spraying method and a spin coating process are carried out.

In this process, the following layer thicknesses are used: For the raw films, layer thicknesses from the region of between 20 μm and 120 μm are used. For the electrode layers, such electrode films are applied, which lead to layer thicknesses within the region of under 10 μm. The uncoupling films are selected in such a way that when sintering, uncoupling layers with layer thicknesses in the region of below 5 μm are formed.

In order to achieve mechanical uncoupling with the help of the uncoupling layers, the uncoupling layer can exhibit excellent characteristics during sintering. Thus the uncoupling layer formed when sintering can function as the diffusion barrier for components of the electrode layer and/or components of the piezoceramic layer. The electrode layer consists of a silver/palladium alloy and the piezoceramic layer of a lead zirconate titanate. As described in the introduction, sintering leads to diffusion processes of the electrode in the direction of the piezoceramic. Silver is introduced to the piezoceramic. This in turn leads to an extremely close and solid bond between the electrode and the piezoceramic. As a result of the fact that the uncoupling layer functions as a diffusion barrier, a migration of silver in the direction of the piezoceramic does not take place. Silver is not included in the piezoceramic. A markedly lower mechanical adhesive strength between the electrode layer and the piezoceramic layer is produced.

As an alternative to this, the uncoupling layer consists of a ceramic. During sintering a compression of the ceramic takes place. In order to achieve a mechanical uncoupling of the electrode layer and the piezoceramic layer, the ceramic uncoupling material is characterized by a shrinkage behavior which differs from the shrinkage behavior of the piezoceramic. This ensures that the piezoceramic layer and the uncoupling layer slide off each other. A relatively slight mechanical contact between the layers is likewise obtained.

The invention claimed is:

1. A piezoelectric component with at least one monolithic piezo element, comprising:
   a first electrode layer;
   at least one second electrode layer; and
   at least one piezoceramic layer located between the first and second electrode layers,
   wherein a non-piezoelectric uncoupling layer which is in direct contact with at least one of the first electrode, the at least one second electrode, and the at least one piezoceramic layers for mechanically uncoupling the one of the first and second electrode layer and the at least one piezoceramic layer is provided at least between one of the first and second electrode layers and the piezoceramic layer.

2. The component as claimed in claim 1, with the uncoupling layer being a partial layer of the electrode layer and/or a partial layer of the piezoceramic layer.

3. The component as claimed in claim 1, with the uncoupling layer being made of a non-piezoelectric uncoupling material selected from the metal and/or the ceramic group.

4. The component as claimed in claim 1, with the uncoupling layer functioning as a diffusion barrier for at least one part of the piezoceramic layer and/or for at least one part of the electrode layer.

5. The component as claimed in claim 1, with the uncoupling layer at a specific temperature exhibiting a thermal expansion which differs from a thermal expansion of the electrode layer and/or from a thermal expansion of the piezoceramic layer by at least 10%.

6. The component as claimed in claim 1, in which a plurality of piezo elements are provided for a monolithic actuator body stacked in the direction of the stack.

7. The component as claimed in claim 1, in which the piezo element and at least one further piezo element is provided for a monolithic actuator body stacked in the direction of the stack, with the further piezo element at least having two further electrode layers and at least one further piezoceramic layer located between electrode layers.

8. The component as claimed in claim 7, with a plurality of the piezo elements and a plurality of the further piezo elements being provided for the monolithic, stacked actuator body comprising:
   adjacent piezo elements in each case have at least one common electrode layer,
   wherein the common electrode layers are routed in the direction of the stack of the actuator body alternately to at least two lateral surface sections of the actuator body which are electrically insulated from each other.

9. The method for producing a piezoelectric component, as claimed in claim 1, with the following steps:

a) Providing a raw stratified body comprising at least one raw ceramic film consisting of a piezoceramic material, at least one electrode consisting of film of an electrode material and at least one uncoupling film which is located between the raw film and the electrode film and which is made of non-piezoelectric uncoupling material and b) Sintering the raw body, with the piezoceramic layer being formed from the raw film, the uncoupling layer from the uncoupling film and the electrode layer from the electrode film.

10. The method as claimed in claim 9, with the following additional steps being carried out for providing a raw body:
   c) Providing the raw ceramic film,
   d) Arranging the uncoupling film on the raw film and
   e) Arranging the electrode film on the uncoupling film.

11. The method as claimed in claim 10, with the uncoupling film consisting of an uncoupling material and/or the electrode film made of an electrode material being provided by carrying out a spin coating process, a silk-screen printing process and/or a vapor deposition process.

12. The method as claimed in claim 9, with an uncoupling layer exhibiting a shrinkage behavior during sintering which differs from the shrinkage behavior of the electrode layer formed when sintering and/or from the shrinkage behavior of the piezoceramic layer formed when sintering, and an adhesion between the layers which form being so negligible that it gives rise to the uncoupling.

13. The component as claimed in claim 2, with the uncoupling layer being made of a non-piezoelectric uncoupling material selected from the metal and/or the ceramic group.

14. The component as claimed in claim 2, with the uncoupling layer functioning as a diffusion barrier for at least one part of the piezoceramic layer and/or for at least one part of the electrode layer.

15. The component as claimed in claim 3, with the uncoupling layer functioning as a diffusion barrier for at least one part of the piezoceramic layer and/or for at least one part of the electrode layer.

16. The component as claimed in claim 2, with the uncoupling layer at a specific temperature exhibiting a thermal expansion which differs from a thermal expansion of the electrode layer and/or from a thermal expansion of the piezoceramic layer by at least 10%.

17. The component as claimed in claim 3, with the uncoupling layer at a specific temperature exhibiting a thermal expansion which differs from a thermal expansion of the electrode layer and/or from a thermal expansion of the piezoceramic layer by at least 10%.

18. The component as claimed in claim 2, in which a plurality of piezo elements are provided for a monolithic actuator body stacked in the direction of the stack.

19. The component as claimed in claim 3, in which a plurality of piezo elements are provided for a monolithic actuator body stacked in the direction of the stack.

20. The component as claimed in claim 2, in which the piezo element and at least one further piezo element is provided for a monolithic actuator body stacked in the direction of the stack, with the further piezo element at least having two further electrode layers and at least one further piezoceramic layer located between then electrode layers.

* * * * *